United States Patent [19]
Hodge et al.

[11] Patent Number: 5,387,541
[45] Date of Patent: Feb. 7, 1995

[54] METHOD OF MAKING SILICON-ON-POROUS-SILICON BY ION IMPLANTATION

[75] Inventors: Alison M. Hodge; John M. Keen, both of Worcestershire, England

[73] Assignee: The Secretary for Defence in Her Britannic Majesty's Government of the United Kingdom of Great Britain and Northern Ireland, London, England

[21] Appl. No.: 50,401
[22] PCT Filed: Nov. 18, 1991
[86] PCT No.: PCT/GB91/02029
  § 371 Date: May 11, 1993
  § 102(e) Date: May 11, 1993
[87] PCT Pub. No.: WO92/09104
  PCT Pub. Date: May 29, 1992

[30] Foreign Application Priority Data
Nov. 20, 1990 [GB] United Kingdom ............... 9025236

[51] Int. Cl.⁶ .......................................... H01L 21/302
[52] U.S. Cl. .......................................... 437/71; 437/18; 437/20; 437/57; 118/DIG. 1; 118/DIG. 3
[58] Field of Search ........................ 437/71, 62, 57, 20, 437/18; 148/DIG. 3, DIG. 1

[56] References Cited

U.S. PATENT DOCUMENTS 5,023,200 6/1991 Blewer ........................ 437/62
5,238,858 8/1993 Matsushita ................... 437/27

FOREIGN PATENT DOCUMENTS 0312466 4/1989 European Pat. Off. .
0220812 4/1985 Germany ...................... 437/20
0220814 4/1985 Germany ...................... 437/20
0056648 5/1981 Japan .......................... 437/71
0177744 8/1986 Japan .......................... 437/71

OTHER PUBLICATIONS

Bomchil, "Porous Silicon: The Material and Its Applications in Silicon-on-Insulator Technologies," *Applied Surface Science* 41/42 (1989) pp. 604-613.
Patent Abstracts of Japan vol. 8, No. 272 (E-284) (1709) Dec. 1984.
Nuclear Instruments & Methods in Physics Research-B vol. 19/20, No. 1 Feb. 1987 pp. 307-311 Thornton et al "Amorphisation of Silicon . . . ".
J. of Applied Physics vol. 58, No. 2, Jul. 1985, pp. 683-687 Seidel et al "Rapid Thermal Annealing of Dopants Implanted into Preamorphized Silicon".

*Primary Examiner*—R. Bruce Breneman
*Assistant Examiner*—Ramamohan Rao Paladugu
*Attorney, Agent, or Firm*—Nixon & Vanderhye

[57] ABSTRACT

The invention provides a method of producing silicon-on-porous-silicon material comprising the steps of (i) manufacturing a porous silicon layer on a suitable silicon wafer, such that the silicon wafer has a porous silicon surface and a non-porous silicon surface, (ii) applying an implanted ion dose to at least a portion of the porous silicon surface such that the dose is sufficient to cause amorphization of porous silicon. The material produced by the method of the invention can then be used for production of silicon-on-insulator material by oxidation of remaining porous silicon and recrystallization of amorphised silicon. Typically such material can be used for manufacture of e.g. SOI C-MOS devices and bipolar transistors. Alternatively, the method of the invention can be used for the manufacture of e.g. pyroelectric devices.

21 Claims, 4 Drawing Sheets

METHOD OF MAKING SILICON-ON-POROUS-SILICON BY ION IMPLANTATION

This invention relates to a method of producing silicon-on-porous-silicon material and to material and device production therefrom.

Porous silicon is a well known material (e.g. G Bomchil et al., Applied Surface Science 41/42 p604 1989). It can be obtained by anodic dissolution (anodizing) of silicon in hydrofluoric acid solutions. It is characterised by a network of fine popes, the number and size of which are determined by doping level of the silicon, dopant impurity type of the silicon and electrochemical parameters during anodizing. Subsequent oxidation of the porous silicon produces an insulating material.

Oxidized porous silicon provides one of the more promising materials for producing SOI (silicon-on-insulator) devices (e.g. N J Thomas et al., IEEE Device Letters 10(3) p129 1989; S S Tsao, IEEE Circuits and Devices Magazine P3 Nov.1987; K Imai and H Unno, IEEE Transactions on Electron Devices ED-31(3) p297 1984). There are two main methods of producing silicon-on-oxidised-porous-silicon. These ape selective formation of porous silicon in order to isolate discrete silicon islands and direct epitaxial deposition on a porous silicon layer, each followed by oxidation of the porous silicon.

The latter of the two above methods has the practical disadvantage of requiring low temperature, minimum time, epitaxial growth conditions, in order to prevent restructuring the underlying porous silicon layer. This method is difficult to control when used for layers of thickness less than 0.25 $\mu$m, and also expensive. For minimal, or zero, added defects the porous silicon must have a porosity of less than 50%. These porosity levels are difficult to achieve in any type of starting silicon material except in $n^-n^+$ and $p^+$. These types of starting material are not optimum for subsequent use in SOI device manufacture. Consequently, SOI material made by this technique uses non-optimum starting material and hence results in a higher than desirable defect density.

In general, the two most used techniques for the selective formation of porous silicon are the Full Isolation by Porous Silicon (FIPOS) p-n approach and the $n/n^+/n$ approach. FIPOS (K Imai, Solid State Electronics 24 p159 1981) uses implantation of protons to form temporary n-type silicon islands in p-type silicon wafers. Subsequently, the p-type silicon only is anodized such that porous silicon completely surrounds the temporary n-type silicon islands. Oxidation converts the temporary n-type silicon to p-type and the porous silicon to $SiO_2$. This technique suffers from a number of inherent disadvantages including those of wafer warpage due to lattice expansion occurring when the p-type porous silicon is oxidised, and also the presence of a thickness non-uniformity located at the centre of the islands. The non-uniformities inter alia induce dislocations within the islands and thus reduce electrical conformity of the n-type silicon.

The above problems were largely overcome by the use of the $n/n^+/n$ technique, where a thin epitaxial layer of $n^-$ silicon is grown on either a $n^+$ doped epitaxial layer of silicon or onto a buried $n^+$ silicon diffusion layer. This method minimises wafer warpage, due to a creation of thinner porous silicon layers, increases the dimensions of silicon islands for which isolation is possible, due to confinement of the porous silicon transformation to lateral dimensions, and eliminates the non-uniformity. This method requires state-of-the-art epitaxial low pressure chemical vapour phase deposition (LPCPD) techniques. Where this technique is used to grow submicron $n^-$ layers, it is particularly difficult to control. Also measurement of layer thicknesses thinner than approximately 0.5 $\mu$m poses a problem as available techniques (e.g. SIMS, cross-sectional TEM and spreading resistance measurement) are destructive. Another disadvantage of this technique is that the extent of lateral anodisation is restricted to 50 $\mu$m.

It is the aim of this invention to provide an alternative method of producing silicon-on-porous-silicon material.

According to this invention a method of producing substantially single crystal silicon-on-porous-silicon material comprises the steps of:

(i) manufacturing a porous silicon layer on a suitable silicon wafer, such that the silicon wafer has a porous silicon surface and a non-porous silicon surface.

(ii) applying an implanted ion dose to at least a portion of the porous silicon surface such that the dose is sufficient to cause amorphisation of porous silicon.

(iii) recrystallization of the amorphous silicon by annealing at a temperature greater than 350° C. to form a substantially single crystal.

The invention is advantageous in that it provides a method of producing silicon-on-porous-silicon material which avoids the use of normal epitaxial growth techniques, uses commonly available semiconductor processing equipment, and is compatible with normal silicon integrated circuit processing.

The porous silicon layer can be produced by standard anodization techniques, typically whereby suitable wafers of silicon are placed in an anodization cell made up of two half cells, each half cell containing a continuously agitated electrolyte, such as aqueous hydrofluoric acid (HF) or ethanoic-HF. The wafer is then anodized by passing a current from an anode, through one of the half cells by means of the electrolyte, through the wafer which normally forms a barrier between the two half cells, through the second half cell and out of the anodization cell via a cathode.

Typically, the silicon wafer is made porous through only part of its thickness. The porous material forms as a layer from the surface in contact with the first half cell electrolyte and into the thickness of the wafer. The layer's outermost surface, i.e. the surface in contact with the electrolyte of the first half cell is termed the porous silicon surface of the wafer, whilst the wafer surface in contact with the electrolyte within the second half cell is termed the non-porous silicon surface. The surface containing the porous silicon surface can be entirely converted to porous silicon, or alternatively only a portion of the surface may be converted to porous silicon.

The composition of the electrolyte used, currents applied, anodization time and resistivity of the starting silicon wafer determine the scale of porosity and depth of the porous silicon layer produced. A typical electrolyte is 40% HF and ethanol of equal volumes at 5.5 $mA/cm^2$. Anodising for 6 minutes results in a porous density of 1.17 $gm/cm^3$ to a depth of 2.6 $\mu$m in a 0.015 $\Omega$-cm n type silicon wafer. Suitable silicon wafers are $n^+$, $p^+$ and $p^-$. $P^-$ wafers are normally subjected to a pre-anodization p+ implant on the non-porous silicon surface and annealed in order to enhance uniformity of current flow through the wafer during anodization.

Step (ii) of the method requires typical doses of greater than $1 \times 10^{14}$ ions/cm$^2$ (at implant energies dependent upon the type of ion used), be applied to at least a portion of the porous silicon surface. The ion implantation may be carried out at room temperature or higher temperatures, such as 500° C. Typical suitable ions for single ion implantation are As+, Ge+, Si+ and Sn+, or for two successive ion implantations, F+ followed by Ge+, Si+ or Sn+ or vice versa. A preferred ion implantation programme is that of $1 \times 10^{16}$ Ge+/cm$^2$ at 80 keV followed by a $1 \times 10^{16}$ F+/cm$^2$ at 35 keV, both carried out at 500° C. Ion implantation with high enough doses induces amorphisation into the depth of the porous silicon layer. Thus amorphised silicon is produced from the porous silicon surface into the depth of the porous silicon layer such that the combined depth of the amorphised silicon and the reduced depth porous silicon is approximately equal to the porous silicon layer prior to amorphisation. Alternatively, the entire depth of the porous silicon layer can be amorphised, in which case the reduced depth porous silicon layer is not present.

Ion implantation is carried out preferably at incidence angles that minimise channelling of the ions down pores or major crystallographic axes. A typical standard industrially used angle of incidence is 7° (i.e. 7° away from normal incidence to the porous silicon surface). Other preferred angles of incidence are 83° and 15°. Other factors which influence the optimum angles of incidence include the degree of porosity and size of pores within the porous silicon layer. It is also common for some ion implantation wafer holders to impart up to about +1° variation in implantation incidence angle from that normally stipulated.

Step (ii) can be carried out by applying an implanted ion dose to all of part of the porous silicon surface. Where the dose is applied to all the porous silicon surface, then the amorphised silicon forms as an amorphised silicon layer on a reduced depth porous silicon layer, unless the entire depth of the porous silicon is amorphised in which case the reduced depth porous silicon layer is not present. However, where the porous silicon surface is masked, e.g. with photoresist, such that only part of the porous silicon surface is exposed to the ion implanted dose, then amorphous ,silicon will be produced into the depth of the porous silicon layer from only those parts of the porous silicon surface which are unmasked. Use of masking in the manner described above results in amorphous silicon islands on the porous silicon surface, which have a depth into the porous silicon layer.

Material produced by the method of the invention is suitable for devices such as pyroelectric devices, where the porous silicon has a smaller thermal conductivity than bulk silicon.

Typical annealing programmes used in step (iii), include annealing temperatures of greater than 350° C. for times dependent upon the annealing temperature, or annealing temperatures, used. Preferred annealing programmes include those of a 3 minute rapid thermal anneal at 950° C. in argon and also 24 hours at 525° C. in flowing nitrogen or argon.

Step (iii) can, where desired, be followed by other steps. In order to produce SOI material suitable for SOI device manufacture, these further steps include those of
(iv) patterning the recrystallized silicon, and
(v) oxidation of porous silicon to produce oxidised porous silicon.

Step (iv) is preferably carried out with knowledge of the type and dimensions of the SOI devices to be made subsequently from the SOI material.

Alternatively, step (v) can be carried out without recrystallization of the porous silicon. Such material would also be suitable for devices such as pyroelectric devices.

Step (iii) can also be preceded by a step where patterning of the amorphous silicon is carried out and include a step after step (iii) where the porous silicon is oxidised or partially oxidised. Patterning of the recrystallized silicon and of the amorphous silicon can be achieved by methods including those of standard lithographic masking and etching techniques. Patterning of the amorphous silicon or recrystallized silicon results in amorphous silicon or recrystallized silicon islands respectively.

Oxidation of the porous silicon is preferably carried out after a stabilizing oxidation. A stabilizing oxidation inhibits the restructuring of the porous silicon. A typical stabilizing oxidation is that of annealing the wafer at 300° C. for 1 hour in flowing oxygen. This is thought to grow an oxide layer of about 1 monolayer thickness as a lining for the pores. Typically, a stabilizing oxidation would be carried out just prior to oxidation of the porous silicon. Alternatively, it can be carried out after patterning the amorphous silicon, prior to recrystallizing the amorphous silicon or after patterning the recrystallized silicon.

Where a stabilizing oxidation has been applied to the wafer, then a typical oxidation programme includes the steps of a 800° C. wet oxidation for 2 hours, followed by 1090° .C wet oxidation for 4 minutes and an optional final step of densification by annealing at a temperature of between about 1150° C. and 1400° C. for a time of between 24 hours and 1 hour respectively. A typical wet oxidation is a pyrogenic process in a wet ambient where $H_2$ and $O_2$ are burnt to give off excess $O_2$ in a steam vapour.

The 800° C. wet oxidation produces a sufficient degree of oxidation, but gives a hydrated oxide. This hydrated oxide is termed "leaky" i.e. it is an oxide with higher conductivity than would be grown in similar conditions on bulk silicon. The 1090° C. wet oxidation or annealing at temperatures of greater than 1000° C. changes the "leaky" oxide to oxidised porous silicon which behaves substantially like a thermally grown oxide. Preferably the oxidation is completed by densification, which is carried out in order to inhibit the dissolution of oxidised porous silicon which could otherwise occur during standard SOI device manufacture.

Steps (i) and (ii) can also be followed by metallization of the porous silicon. Thus, where the amorphous silicon forms a skin layer on the porous silicon layer the porous silicon is accessed by e.g. standard masking and etching techniques. Where the amorphous silicon is formed as islands on the surface of the porous silicon layer, then there is surface access to the porous silicon for metallization. Metallization is a known technique (e.g. S S Tsao et al., Applied Physics Letters 49(7) p403 1988; T Ito et al., Applied Surface Science 33/34 p1127 1988) and typically metals such as tungsten in a gaseous form are applied to the silicon-on-porous-silicon using LPCVD techniques at elevated temperatures. The porous silicon preferentially takes up the metal and is substantially completely converted to metal whilst the porous silicon is removed in vapour form. The resulting silicon-on-metal material may be used for devices where buried channels or buried contacts are required.

In order that the invention be more fully understood, it will now be described by example only and with reference to the accompanying figures, in which.

Figure 1:
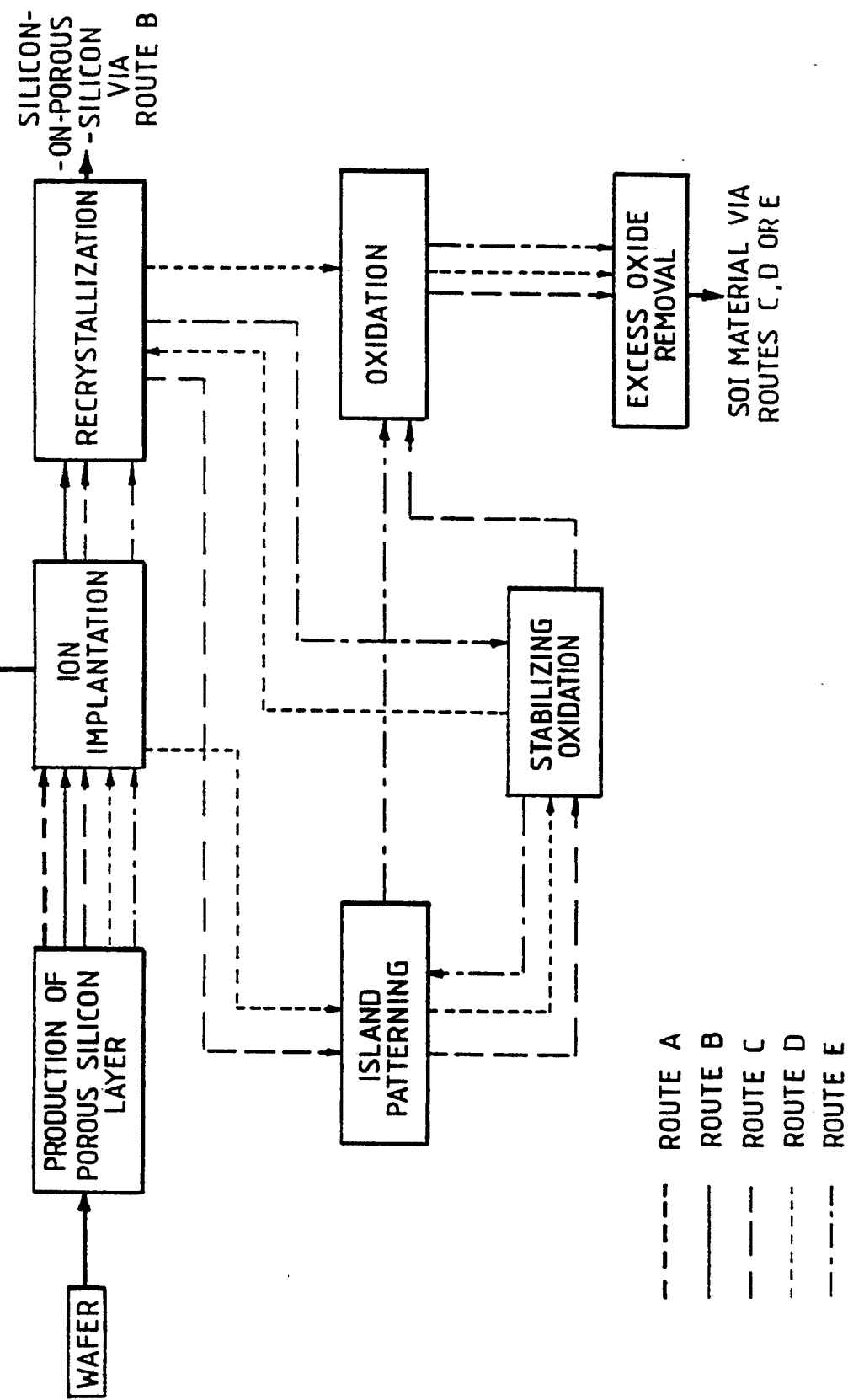
FIG. 1 is a flow diagram including processing steps for carrying out the invention to produce silicon-on-porous-silicon material and SOI material.
Figure 2:
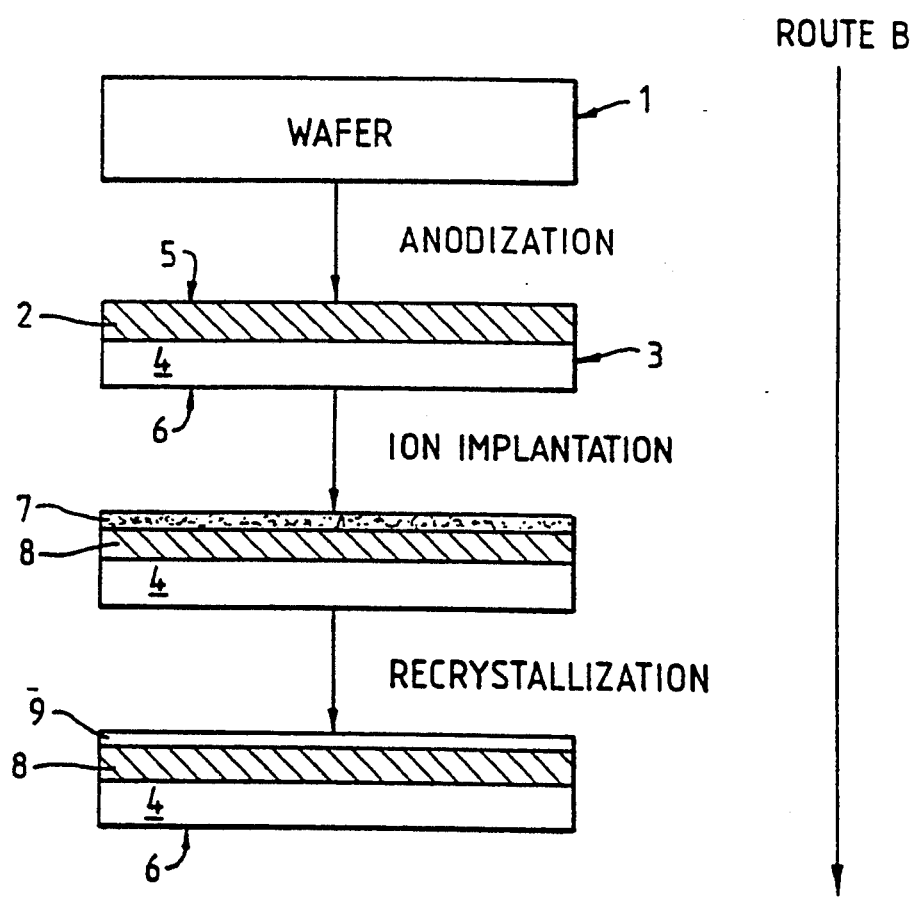
FIG. 2 is a schematic diagram of the changes made to a silicon wafer during the processing steps of Route B of FIG. 1.

As may be seen in FIG. 1, Routes A and B describe the processing steps to be followed to produce silicon-on-porous-silicon. Route A results in silicon-on-porous-silicon in the form of amorphous silicon on porous silicon, whilst Route B results in silicon-on-porous-silicon in the form of recrystallized silicon on porous silicon. FIG. 2 also outlines the processing steps of Route B of FIG. 1 and FIG. 4 describes the processing steps for Route A, where the amorphous silicon is produced as amorphous silicon islands.

As outlined in FIG. 2 a three inch Czochralski-grown n+ silicon wafer 1 (of dopant density $2.3 \times 10^{16}$ cm$^{-3}$ and resistivity of about 0.015 $\Omega$-cm) is placed in anodization equipment such as that described by patent application number GB 8923,709. The wafer is anodized at a current density of 5.5 mA/cm$^2$ in an electrolyte consisting of equal volumes of 40% HF and ethanol, resulting in anodized wafer 3 having porous silicon layer 2 and silicon substrate 4. After anodization for 6 minutes, the process produces a porous silicon layer 2.6 $\mu$m thick where the porous silicon layer has a porous density of 1.17 gm/cm$^3$ i.e. a porosity of 50%. Pores in such a porous silicon layer have sizes of about 4.24 nm. as measured by the BET technique which is a gas adsorption/desorption technique. After anodization the anodised wafer 3 is removed from the anodization apparatus, rinsed with deionised water and spun dry. The wafer now has a porous silicon surface 5 and a non-porous silicon surface 6.

The anodized wafer 3 is then placed in a sample holder of an ion implanter with the non-porous silicon surface 6 in contact with the sample holder. The anodised wafer and sample holder are then set up such that bombardment of the porous silicon surface 5 by ions is at an incidence of about 7° (with allowances for up to $\pm 1$° variation due to induced wafer bending imparted by some sample holders). After evacuating the ion implanter and heating the sample holder to 500° C., the porous silicon surface 5 is bombarded by firstly Ge+ with an energy of 80 keV to a dose level of $1 \times 10^{16}$ cm$^{-3}$ and secondly by F+ ions at an energy level of 35 keV to a dosage level of $1 \times 10^{16}$ cm$^{-3}$. The ion implantation process as described above and with reference to FIG. 2 provides an amorphous silicon skin layer 7 of 0.3 $\mu$m depth and a porous silicon layer 8, where the porous silicon layer 8 and the amorphous silicon layer 7 have a combined depth substantially equal to the depth of the porous silicon layer 2 . Where only a portion of the porous silicon surface 5 is accessible to the bombardment of implanted ions (due to e.g. previous masking), then amorphous silicon islands are formed in the porous silicon layer 2.

After ion implantation to form the amorphous silicon skin layer 7, the silicon-on-porous-silicon material produced by the Route described above can be further processed by carrying out step (iii), where step (iii) is recrystallization of the amorphous silicon. The addition of step (iii) to Route A is denoted as Route B on FIG. 1.

Recrystallization of silicon skin layer 7 is achieved by annealing. Typical annealing programmes 3 minutes of rapid thermal annealing at 950° C. in an argon environment or a 24 hour anneal at 525° C. in a nitrogen environment. The recrystallization produces a substantially single crystal recrystallized silicon layer 9 on the porous silicon layer 8.

The silicon-on-porous-silicon produced by Route B of FIGS. 1 and 2 can then be used for the manufacture of SOI material. SOI devices require a thin layer of silicon on an insulator. For fully depleted (i.e. the channel region of the device becomes majority carrier free) thin film CMOS devices the silicon layer needs to be less than 0.25 $\mu$m thick. Silicon-on-porous-silicon material produced by Route B above is particularly suited for SOI device manufacture as it is possible to use this method to produce a silicon layer thin enough for SOI device requirements. Alternatively the silicon-on-porous-material produced by the methods of Routes A and B can be used as base material for further epitaxial growth and also as material suitable for metallisation by e.g. Tungsten.

Figure 3:
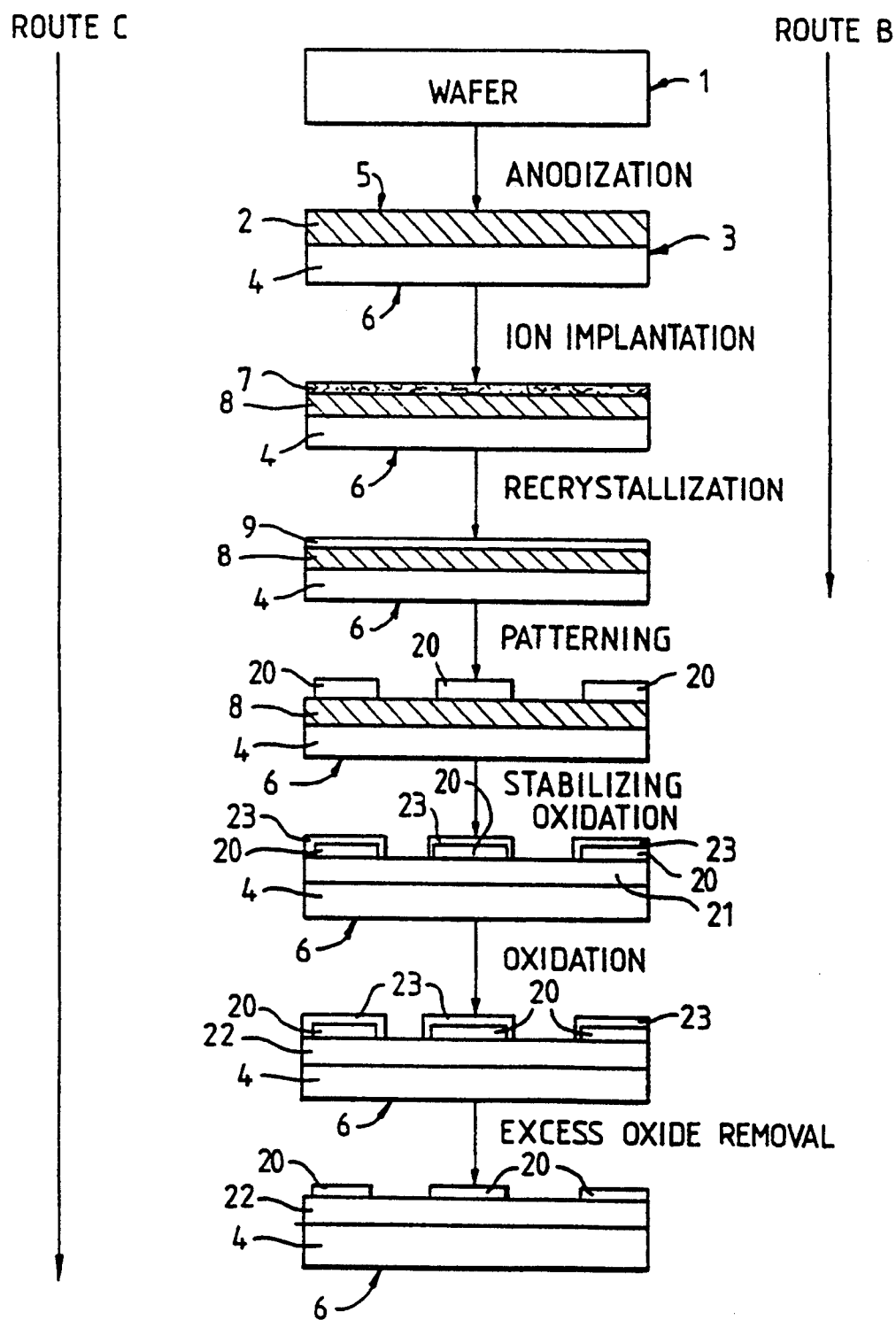
FIG. 3 is a schematic diagram of the changes made to a silicon wafer during the processing steps of Route C of FIG. 1.

FIG. 3 is a schematic diagram showing additional method steps that can be carried out on the silicon-on-porous-silicon material produced by Route B in order to produce SOI material. The processing steps shown in FIG. 3 are denoted as Route C in FIG. 1.

As outlined in FIG. 3, silicon island definition follows the manufacture of silicon-on-porous-silicon by Route B. Such definition may be carried out to provide standard island morphologies, or preferably to provide morphologies specifically required for particular device manufacture.

Silicon island definition is commonly carried out by photolithography and dry etching, in order to selectively etch away unwanted silicon material. Typically such a process would involve covering the recrystallized silicon surface 10 with photoresist, selectively exposing the photoresist which covers areas of unwanted recrystallized silicon to U-V radiation by means off masking off required areas of recrystallized silicon, and selectively dry etching away the unwanted recrystallized silicon whilst photoresist protects the required areas of recrystallized silicon. The required areas of recrystallized silicon are device islands 20.

After device island patterning, the porous silicon layer 8 undergoes a stabilizing oxidation. Such an oxidation is often used to protect porous silicon from being restructured during subsequent processing steps requiring elevated temperatures. A typical stabilizing oxidation programme anneals the anodized wafer 3 at 300° C. for 1 hour in an oxygen ambient. Such a programme is thought to grow an oxide layer of about one monolayer thickness as a lining of the pores within the porous silicon layer to produce a stabilized, partially oxidised, porous silicon layer 21.

After a stabilizing oxidation an oxidation programme can be carried out. A typical oxidation programme includes the steps of a 800° C. wet oxidation for 2 hours, followed by a 1090° C. wet oxidation for 6 minutes and an optional final step of densification by typically annealing at a temperature of between 1150° C. and 1400° for a time of between 24 hours and 1 hour respectively. A typical wet oxidation is a pyrogenic process in a wet ambient where $H_2$ and $O_2$ are burnt to give off excess $O_2$ in a steam vapour.

The 800° C. oxidation produces a sufficient degree of oxidation, but is hydrated. This gives a "leaky" oxide. The 1090° C. wet oxidation changes the "leaky" oxide to give oxidised porous silicon layer 22, which behaves substantially like a thermally grown oxide. Densification is carried out in order to inhibit the dissolution of the oxidised porous silicon layer 22, which could otherwise occur during SOI device standard manufacture.

Following oxidation, removal of excess oxide 23 formed during oxidation leads to silicon (in the form of device islands 20) on insulator (in the form of oxidised porous silicon layer 22) material.

As can be seen from FIG. 1, Route C is not the only manufacturing method by which SOI material can be obtained. Other typical Routes include those shown as Routes D and E on FIG. 1. SOI device manufacture can be carried out on the SOI material obtained by the production methods as described by FIG. 1 by such well known production technologies as e.g. ion implantation etc. Typical SOI devices for which such SOI material may be used include C-MOS and bipolar devices.

Material produced by Route A can alternatively be produced where only a portion of the porous silicon surface is bombarded with an implanted ion dose which is sufficient to amorphise porous silicon. A schematic representation of the above production method may be seen in FIG. 4. Wafer 1 is anodized in the manner described above, such that the anodized wafer 3 has a porous silicon layer 2 on a substrate 4, with porous silicon surface 5 and non-porous silicon surface 6. A layer of photoresist 30 is then spun on the porous silicon surface. Photoresist covering selected areas of the porous silicon surface is then exposed to U-V radiation. Subsequent etching of the photoresist with a suitable etchant results in the selected areas of the porous silicon surface being revealed, whilst non-selected areas of the porous silicon surface remain masked by the remaining photoresist. The anodized wafer is then ion implanted as described above with reference to FIG. 2, resulting in amorphous silicon islands 31 extending into the depth of the porous silicon layer from the portion of the porous silicon surface not masked by the photoresist. Stripping away of the resist covering the non-selected areas of the porous silicon surface gives amorphous-silicon-on-porous-silicon material.

Figure 4:
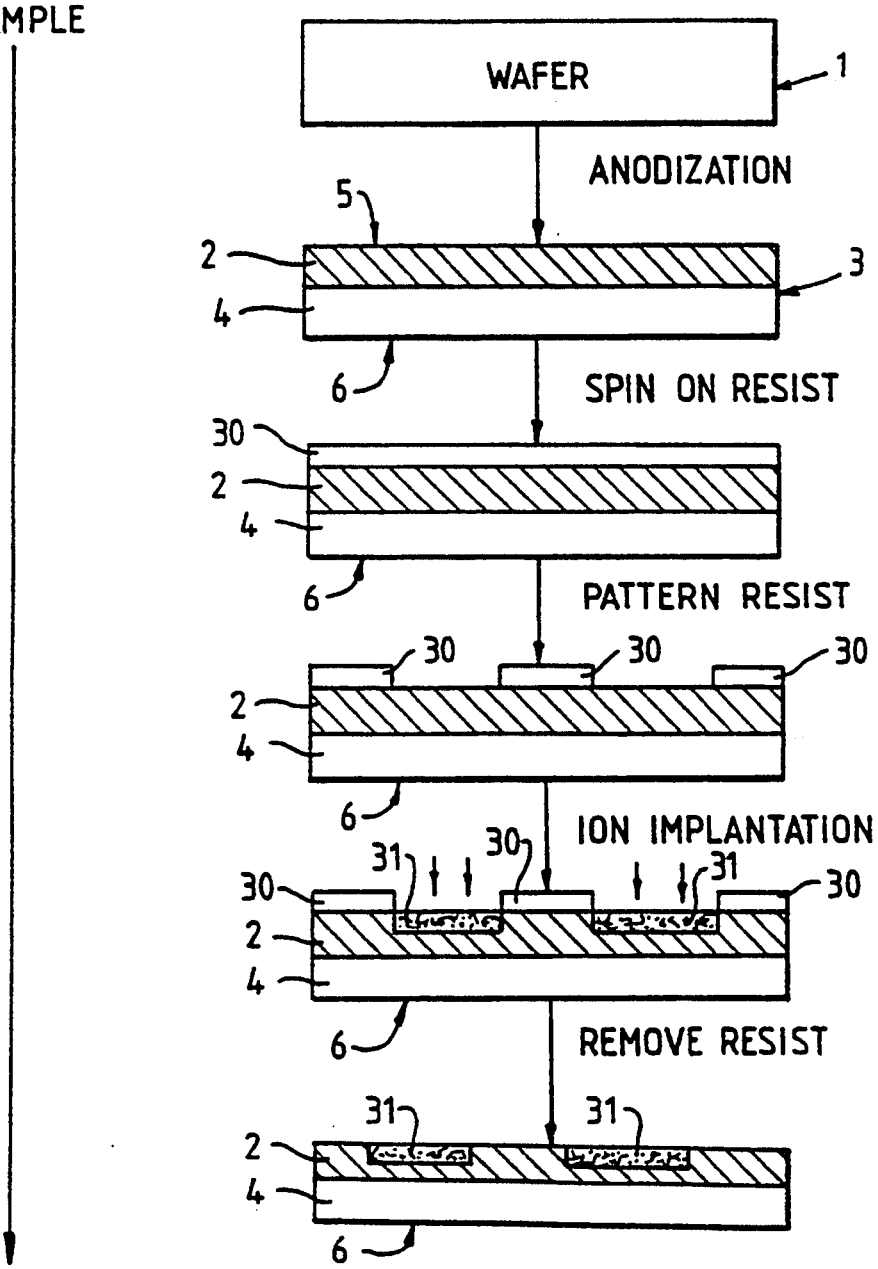
FIG. 4 is a schematic diagram of the changes made to a silicon wafer during the processing steps of Route A, where masking is employed to produce amorphous silicon islands.

The material produced by the method described by Route A and FIG. 4 can be used for inter alia the manufacture of metallized material by e.g. Tungsten, recrystallized-silicon-on-porous-silicon material, SOI material obtained by e.g. the methods described above with reference to FIGS. 2 and 3 and also devices such as pyroelectric, SOI C-MOS and SOI bipolar devices.

We claim:

1. A method of producing substantially single crystal silicon-on-porous-silicon comprising the steps of:
    (i) manufacturing a porous silicon region on a silicon wafer, such that the silicon wafer has a porous silicon surface and a non-porous silicon surface;
    (ii) applying an implanted ion dose to at least a portion of the porous silicon surface to form a layer of amorphous silicon on a remaining region of porous silicon; and
    (iii) recrystallizing the amorphous silicon by annealing at a temperature greater than 350° C. to form a substantially single crystal layer of silicon on the remaining region of porous silicon.

2. A method according to claim 1 where the ion implantation is carried out at room temperature.

3. A method according to claim 1 where the ion implantation is carried out with a single species of ion.

4. A method according to claim 3 where the single species of ion is taken from the list of $As^+$, $Ge^+$, $Si^+$ and $Sn^+$.

5. A method according to claim 1 where the ion implantation is carried out with two successive ion implantations.

6. A method according to claim 5 where the successive ion implantations are carried out with $F^+$ followed by an ion taken from the list of $Ge^+$, $Si^+$ and $Sn^+$.

7. A method according to claim 5 where the successive ion implantations are carried out with one ion taken from the list of $Ge^+$, $Si^+$ and $Sn^+$ followed by $F^+$.

8. A method according to claim 1 where the ion dose is implanted at an angle of incidence $7° \pm$.

9. A method according to claim 1 where the porous silicon is metallised.

10. A method of claim 1 where the silicon of the silicon-on-porous-silicon is patterned.

11. A method according to claim 1 and further comprising a step of carrying out a stabilizing oxidation of the porous silicon.

12. A method according to claim 11 where the stabilizing oxidation is carried out prior to patterning of the silicon.

13. A method according to claim 1 and further comprising a step where the porous silicon is at least partially oxidised.

14. A method according to claim 13 and further comprising a densification step.

15. A semiconductor device manufactured from material as claimed in claim 1.

16. A method of producing substantially single crystal silicon-on-porous-silicon comprising the steps off
    (i) manufacturing a porous silicon region on a silicon wafer, such that the silicon wafer has a porous silicon surface and a non-porous silicon surface;
    (ii) applying an implantation dose of greater than $1 \times 10^{14}$ ions/cm$^2$ in two successive ion implantations, with a first ion implantation by $F^+$ ions followed by a second ion implantation by a species of ion selected from the group consisting of $Ge^+$, $Si^+$ and $Sn^+$, to at least a portion of the porous silicon surface to form a layer of amorphous silicon on a remaining region of porous silicon; and
    (iii) recrystallizing the amorphous silicon by annealing at a temperature greater than 350° C. to form a substantially single crystal layer of silicon on the remaining region of porous silicon.

17. A method of producing substantially single crystal silicon-on-porous-silicon comprising the steps of:
    (i) manufacturing a porous silicon region on a silicon wafer, such that the silicon wafer has a porous silicon surface and a non-porous silicon surface;
    (ii) applying an implantation ion dose of greater than $1 \times 10^{14}$ ions/cm$^2$ in two successive ion implantations, with a first ion implantation by a species of ion selected from the group consisting of $Ge^+$, $Si^+$ and $Sn^+$ followed by a second ion implantation by F+ ions, to at least a portion of the porous silicon surface to form a layer of amorphous silicon on a remaining region of porous silicon; and (iii) recrystallizing the amorphous silicon by annealing at a temperature greater than 350° C. to form a substantially single crystal layer of silicon on the remaining region of porous silicon.

18. A method of producing silicon-on-porous-silicon comprising the steps of:

(i) manufacturing a porous silicon region on a silicon wafer such that the silicon wafer has a porous silicon surface and a non-porous silicon surface; and (ii) applying an implantation ion dose to at least a portion of the porous silicon surface to form a layer of amorphous silicon on a remaining region of porous silicon.

19. A method of producing silicon-on-porous-silicon according to claim 20 and further comprising the step of annealing the wafer to recrystallize the amorphous silicon.

20. A method according to claim 20 wherein the ion implantation is carried out in two successive ion implantations with a first ion implantation by F+ ions and a second ion implantation by a single species of ion selected from the group consisting of Ge+, Si+ and Sn+.

21. A method according to claim 20 wherein the ion implantation is carried out in two successive ion implantations with a first ion implantation by a single species of ion selected from the group consisting of Ge+, Si+ and Sn+ and a second ion implantation by F+ ions.

* * * * *

UNITED STATES PATENT AND TRADEMARK OFFICE
CERTIFICATE OF CORRECTION

PATENT NO. : 5,387,541
DATED : February 7, 1995
INVENTOR(S) : Alison M. HODGE et al It is certified that error appears in the above-identified patent and that said letters patent is hereby corrected as shown below:

Col. 10,

Claim 19, line 4, change "20" to --18--.
Claim 20, line 1, change "20" to --18--.
Claim 21, line 1, change "20" to --28--.

Signed and Sealed this

Thirtieth Day of May, 1995

Attest:

BRUCE LEHMAN

Attesting Officer

Commissioner of Patents and Trademarks